(12) United States Patent
Miyanaga et al.

(10) Patent No.: US 10,676,667 B2
(45) Date of Patent: Jun. 9, 2020

(54) QUANTUM DOT, MANUFACTURING METHOD OF THE DOT, AND COMPACT, SHEET MEMBER, WAVELENGTH CONVERSION MEMBER AND LIGHT EMITTING APPARATUS USING THE QUANTUM DOT

(71) Applicant: NS MATERIALS INC., Fukuoka (JP)

(72) Inventors: Akiharu Miyanaga, Fukuoka (JP); Eiichi Kanaumi, Fukuoka (JP); Yoshikazu Nageno, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 15/696,524

(22) Filed: Sep. 6, 2017

(65) Prior Publication Data

US 2018/0010042 A1    Jan. 11, 2018

Related U.S. Application Data

(62) Division of application No. 15/302,048, filed as application No. PCT/JP2015/060612 on Apr. 3, 2015, now Pat. No. 10,266,769.

(30) Foreign Application Priority Data

Apr. 8, 2014  (JP) .................................. 2014-079562

(51) Int. Cl.
  *B22F 9/24*  (2006.01)
  *B22F 9/16*  (2006.01)
  (Continued)

(52) U.S. Cl.
  CPC .......... *C09K 11/883* (2013.01); *B01D 21/262* (2013.01); *B01J 13/02* (2013.01);
  (Continued)

(58) Field of Classification Search
  CPC ....... B82Y 20/00; B82Y 30/00; C09K 11/025; C09K 11/883; C09K 11/54; G02B 5/22;
  (Continued)

(56) References Cited

U.S. PATENT DOCUMENTS

| | | | |
|---|---|---|---|
| 5,970,804 A | 10/1999 | Robbat, Jr. | |
| 6,261,779 B1 * | 7/2001 | Barbera-Guillem | G01N 33/54306 435/6.11 |

(Continued)

FOREIGN PATENT DOCUMENTS

| | | |
|---|---|---|
| JP | 2007-227355 | 9/2007 |
| JP | 2008-130279 | 6/2008 |

(Continued)

OTHER PUBLICATIONS

Bai et al., "Rapid Separation and Purification of Nanoparticles in Organic Density Gradients", J. Am. Chem. Soc. 9 vol. 132, No. 7, 2010 2337.*

(Continued)

*Primary Examiner* — Brian Turner
(74) *Attorney, Agent, or Firm* — Greenblum & Bernstein, P.L.C.

(57) ABSTRACT

To provide a quantum dot and manufacturing method of the dot particularly capable of reducing organic residues adhering to the quantum dot surface and of suppressing the black discoloration occurrence of a layer including the quantum dot positioned immediately above a light emitting device, and a compact, sheet member, wavelength conversion member and light emitting apparatus with high luminous efficiency using the quantum dot, a quantum dot of the present invention has a core portion including a semiconductor particle, and a shell portion with which the surface of the core portion is coated, and is characterized in that a weight reduction up to 490° C. is within 75% in a TG-DTA profile.

(Continued)

Further, the quantum dot of the invention is characterized in that oleylamine (OLA) is not observed in GC-MS qualitative analysis at 350° C.

2 Claims, 12 Drawing Sheets

(51) Int. Cl.

| | | |
|---|---|---|
| *C09K 11/88* | (2006.01) | |
| *B01J 13/04* | (2006.01) | |
| *H01L 33/54* | (2010.01) | |
| *B01D 21/26* | (2006.01) | |
| *B82Y 30/00* | (2011.01) | |
| *B01J 13/02* | (2006.01) | |
| *B01J 13/22* | (2006.01) | |
| *C09B 67/02* | (2006.01) | |
| *H01L 33/50* | (2010.01) | |
| *H01L 33/56* | (2010.01) | |
| *B82Y 20/00* | (2011.01) | |
| *B82Y 40/00* | (2011.01) | |

(52) U.S. Cl.
CPC .............. *B01J 13/04* (2013.01); *B01J 13/22* (2013.01); *B82Y 30/00* (2013.01); *C09B 67/0097* (2013.01); *H01L 33/502* (2013.01); *H01L 33/507* (2013.01); *H01L 33/54* (2013.01); *H01L 33/56* (2013.01); *B82Y 20/00* (2013.01); *B82Y 40/00* (2013.01); *H01L 2224/48091* (2013.01); *Y10S 977/774* (2013.01); *Y10S 977/892* (2013.01); *Y10S 977/896* (2013.01); *Y10S 977/95* (2013.01)

(58) Field of Classification Search
CPC ........... G02B 2207/101; Y10S 977/774; Y10S 977/824; H01B 1/02
See application file for complete search history.

(56) References Cited

U.S. PATENT DOCUMENTS

| | | | |
|---|---|---|---|
| 8,597,730 B2 | 12/2013 | Pickett et al. | |
| 2004/0091625 A1 | 5/2004 | Winter | |
| 2005/0212420 A1 | 9/2005 | Sakakura | |
| 2005/0265922 A1 | 12/2005 | Nie | |
| 2006/0032755 A1 | 2/2006 | Herman et al. | |
| 2007/0012928 A1* | 1/2007 | Peng | B82Y 20/00 257/79 |
| 2007/0012941 A1* | 1/2007 | Cheon | B82Y 20/00 257/99 |
| 2007/0128350 A1* | 6/2007 | Nakamura | B82Y 30/00 427/157 |
| 2007/0138460 A1 | 6/2007 | Choi et al. | |
| 2007/0278457 A1 | 12/2007 | Nakamoto et al. | |
| 2008/0159657 A1 | 7/2008 | Kanevsky et al. | |
| 2009/0278141 A1* | 11/2009 | Coe-Sullivan | B82Y 20/00 257/89 |
| 2010/0068522 A1 | 3/2010 | Pickett et al. | |
| 2011/0130297 A1* | 6/2011 | Badorrek | B82Y 15/00 506/7 |
| 2012/0007107 A1 | 1/2012 | Choi | |
| 2012/0205621 A1* | 8/2012 | Cheon | B82Y 20/00 257/13 |
| 2012/0241646 A1 | 9/2012 | Zhong et al. | |
| 2013/0003227 A1 | 1/2013 | Lowery | |
| 2013/0115455 A1* | 5/2013 | Banin | C09K 11/025 428/375 |
| 2013/0134366 A1* | 5/2013 | Battaglia | B82Y 20/00 252/519.4 |
| 2013/0193837 A1 | 8/2013 | Ohno | |
| 2013/0228812 A1 | 9/2013 | Annen et al. | |
| 2013/0264732 A1* | 10/2013 | Youngblood | B29C 41/24 264/28 |
| 2013/0266800 A1 | 10/2013 | Buonsanti | |
| 2013/0271700 A1 | 10/2013 | Nakamura et al. | |
| 2013/0280854 A1 | 10/2013 | Jasieniak et al. | |
| 2014/0011317 A1 | 1/2014 | Gresty et al. | |
| 2014/0022779 A1 | 1/2014 | Su | |
| 2014/0069456 A1* | 3/2014 | Lee | B08B 7/028 134/1 |
| 2014/0155640 A1 | 6/2014 | Pickett et al. | |
| 2014/0168571 A1 | 6/2014 | Hyun | |
| 2014/0326921 A1* | 11/2014 | Lu | C30B 7/08 252/301.6 S |
| 2015/0004310 A1 | 1/2015 | Greytak et al. | |
| 2015/0136229 A1 | 5/2015 | Suto | |
| 2015/0203989 A1 | 7/2015 | Xu | |
| 2016/0221831 A1* | 8/2016 | Bakr | C01B 32/28 |
| 2016/0347996 A1 | 12/2016 | Shimamoto | |
| 2016/0380140 A1 | 12/2016 | McDaniel | |

FOREIGN PATENT DOCUMENTS

| | | |
|---|---|---|
| JP | 2009-91429 | 4/2009 |
| JP | 2010-31115 | 2/2010 |
| JP | 2011-530187 | 12/2011 |
| JP | 2012-204609 | 10/2012 |
| JP | 2013-204005 | 10/2013 |
| WO | 2012/161065 | 11/2012 |

OTHER PUBLICATIONS

Cole et al. ("Analytical Ultracentrifugation: Sedimentation Velocity and Sedimentation Equilibrium", Methods Cell Biol. 2008 ; 84: 143-179. doi:10.1016/S0091-679X(07)84006-4. (Year: 2008).*
Smith et al. ("Minimizing the Hydrodynamic Size of Quantum Dots with Multifunctional Multidentate Polymer Ligands", J Am Chem Soc. Aug. 27, 2008; 130(34): 11278-11279. doi:10.1021/ja804306c. (Year: 2008).*
International Search Report, along with English-language translation thereof, in Appl. No. PCT/JP2015/060612, dated Jun. 16, 2015.
Office Action for U.S. Appl. No. 16/131,237, dated Apr. 11, 2019.
Office Action for U.S. Appl. No. 16/131,237, dated Oct. 10, 2019.
Advisory Action for U.S. Appl. No. 16/131,237, dated Feb. 6, 2020.

* cited by examiner

QUANTUM DOT, MANUFACTURING METHOD OF THE DOT, AND COMPACT, SHEET MEMBER, WAVELENGTH CONVERSION MEMBER AND LIGHT EMITTING APPARATUS USING THE QUANTUM DOT

CROSS-REFERENCE TO RELATED APPLICATIONS

This is a Divisional of U.S. patent application Ser. No. 15/302,048, filed Oct. 5, 2016, which is a National Stage Application of PCT/JP2015/060612, filed Apr. 3, 2015, which claims the benefit of Japanese Patent Application No. 2014-079562, filed Apr. 8, 2014. The disclosure of each of the above-identified applications, including the specification, drawings, and claims, is incorporated herein by reference in its entirety.

TECHNICAL FIELD

The present invention relates to a quantum dot, manufacturing method of the dot, and a compact, sheet member, wavelength conversion member and light emitting apparatus using the quantum dot.

BACKGROUND ART

A quantum dot is a nanoparticle having a particle diameter of about several nanometers to several tens of nanometers comprised of about several hundred to thousand semiconductor atoms, and forms a quantum well structure. The quantum dot is also called the nanocrystal.

For the quantum dot, it is possible to modify a peak emission wavelength in various manners, corresponding to the particle diameter and composition of the crystal. For example, as in Patent Documents 1 and 2, a light emitting apparatus is known where a fluorescent layer including quantum dots is arranged around an LED chip.

PRIOR ART DOCUMENT

Patent Document

[Patent Document 1]
Japanese Unexamined Patent Publication No, 2008-130279
[Patent Document 2]
Japanese Unexamined. Patent Publication No. 2012-204609

DISCLOSURE OF INVENTION

Problems to be Solved by the Invention

However, in conventional light emitting apparatuses, it has been found that black discoloration occurs in the fluorescent layer including quantum dots positioned immediately above the LED chip by emission of the LED chip, and that luminous efficiency of the light emitting apparatus deteriorates. Then, the applicant found out that a cause of black discoloration of the fluorescent layer is an effect of organic residues deriving from quantum dot raw materials adhering (adsorbed) to the quantum dot surface.

The present invention was made in view of such a respect, and it is an object of the invention to provide a quantum dot and manufacturing method of the dot particularly capable of reducing organic residues adhering to a quantum dot surface and of suppressing the black discoloration occurrence of a layer including the quantum dot positioned immediately above a light emitting device, and a compact, sheet member, wavelength conversion member and light emitting apparatus with high luminous efficiency using the quantum dot.

Means for Solving the Problem

A quantum dot in the present invention is characterized in that a weight reduction up to 490° C. is within 75% in a TG-DTA profile.

Further, a quantum dot in the invention is characterized in that oleylamine (OLA) is not observed in GC-MS qualitative analysis at 350° C. At this point, it is preferable that trioctylphosphine (TOP) is not observed in GC-MS qualitative analysis at 350° C. In addition, it is preferable that a weight reduction up to 490° C. is within 75% in a TG-DTA profile.

Further, a quantum dot in the invention is characterized by being cleaned with an ultracentrifuge.

Furthermore, the quantum dot in the invention may be comprised by having a core portion including a semiconductor particle and a shell portion with which the surface of the core portion is coated.

Still furthermore, in the invention, the shell portion is capable of being made a configuration having a first shell portion with which the core portion is coated, and a second shell portion with which the surface of the first shell portion is coated.

Moreover, a compact in the invention is characterized by being made by having the quantum dot as described in one of above-mentioned items. Further, a sheet member in the invention is characterized by being made by having the quantum dot as described in one of above-mentioned items. Furthermore, a wavelength conversion member in the invention is characterized by having a container provided with storage space, and a wavelength conversion layer including the quantum dot as described in one of above-mentioned items disposed inside the storage space to be comprised thereof.

Further, the invention provides a light emitting apparatus having a fluorescent layer covering a light emitting side of a light emitting device, and is characterized in that the fluorescent layer is formed of a resin with the quantum dot as described in one of above-mentioned items dispersed.

Furthermore, the invention provides a light emitting apparatus having a fluorescent layer covering a light emitting side of a light emitting device, and is characterized in that the fluorescent layer is formed of a resin with the quantum dot dispersed, and that black discoloration by emission of the light emitting device does not occur in the resin layer.

Still furthermore, the invention provides a method of manufacturing a quantum dot having a core portion including a semiconductor particle, and is characterized in that a quantum dot solution is prepared by having a step of synthesizing the semiconductor particle to form the core portion, and that an ultracentrifuge is used in a step of cleaning the quantum dot solution.

In the invention, the method includes a step of coating the surface of the core portion with the shell portion after the step of forming the core portion, and it is possible to shift to the cleaning step after coating with the shell portion.

Further, in the invention, the shell portion is capable of being formed by having a first shell portion with which the core portion is coated, and a second shell portion with which the surface of the first shell portion is coated.

Advantageous Effect of the Invention

According to the present invention, it is possible to provide the quantum dot with little adhesion of the organic residue on its surface, and it is possible to manufacture such a quantum dot with ease efficiently.

Further, it is possible to effectively suppress the black discoloration occurrence of the layer including the quantum dot positioned immediately above the light emitting device.

BEST MODE FOR CARRYING OUT THE INVENTION

Figure 1A:
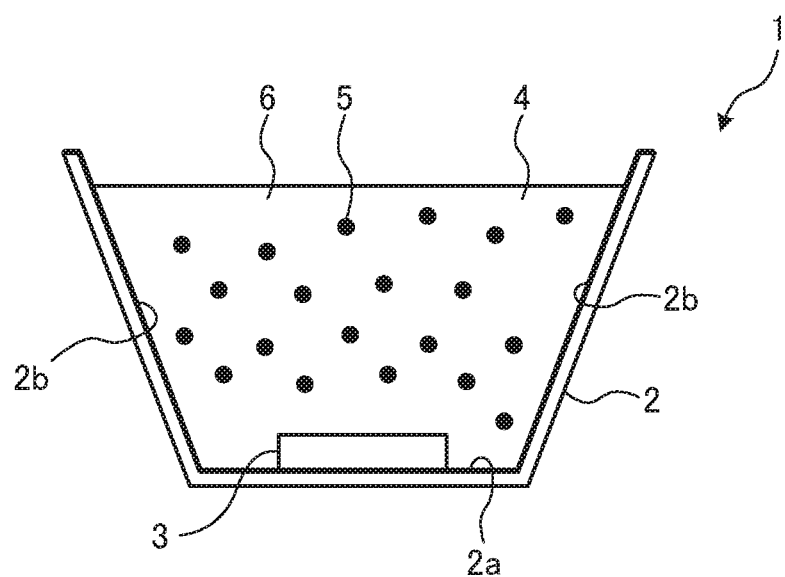
FIGS. 1A and 1B are schematic diagrams of an LED apparatus (light emitting apparatus)

Embodiments of the present invention will specifically be described below. As shown in FIG. 1A, an LED apparatus (light emitting apparatus) 1 has a storage case 2 having a bottom 2a and side walls 2b surrounding the circumference of the bottom 2a, an LED chip 3 disposed on the bottom 2a of the storage case 2, and a fluorescent layer 4 filled inside the storage case 2 to seal the upper surface side of the LED chip 3. Herein, the upper surface side is a direction in which light emitted from the LED chip 3 is released from the storage case 2, and indicates a direction opposite to the bottom 2a with respect to the LED chip 3. Further, in this Embodiment, the LED chip 3 is included in components of the light emitting apparatus. Alternatively, the LED chip 3 may be provided separately from the light emitting apparatus. For example, it is possible to make a configuration where the LED chip 3 is disposed outside the light emitting apparatus.

The LED chip 3 is disposed on a base wiring board not shown, and the base wiring board may constitute a bottom portion of the storage case 2. As the base board, for example, it is possible to present a configuration where a wiring pattern is formed on a substrate of glass epoxy resin or the like.

The LED chip 3 is a semiconductor device that emits light in applying the voltage in the forward direction, and is provided with a basic configuration where a P-type semiconductor layer and N-type semiconductor layer are subjected to PN junction. Alternatively, as a substitute for the LED chip 3, it is also possible to use a semiconductor laser and light emitting device such as an EL (Electro• Luminescence) device.

As shown in FIG. 1A, the fluorescent layer 4 is formed of a resin 6 with many quantum dots 5 dispersed.

Further, a resin compact in this Embodiment may include the quantum dot 5 and another fluorescent substance as a fluorescent pigment, fluorescent dye or the like different from the quantum dot 5. For example, there are quantum dots of red light emission and fluorescent substance of green light emission, or quantum dots of green light emission and fluorescent substance of red light emission. Among the fluorescent substances are a YAG (yttrium•aluminum•garnet) series, TAG (terbium•aluminum•garnet) series, sialon series, BOS (barium•orthosilicate) series and the like, but materials are not limited particularly. It is possible to apply such forms to forms other than the form of FIG. 1A or 1B as appropriate.

The resin 6 constituting the fluorescent layer 4 is not limited particularly, and it is possible to use polypropylene, polyethylene, polystyrene, AS resin, ABS resin, methacrylate resin, polyvinyl chloride, polyacetal, polyamide, polycarbonate, modified-polyphenylene ether, polybutylene terephthalate, polyethylene terrain terephthalate, polysulfone, polyether sulfone, polyphenylene sulfide, polyamide imide, polymethyl pentene, liquid crystal polymer, epoxy resin, phenol resin, urea resin, melamine resin, epoxy resin, diallyl phthalate resin, unsaturated polyester resin, polyimide, polyurethane, silicone resin, mixtures thereof and the like.

Figure 2:
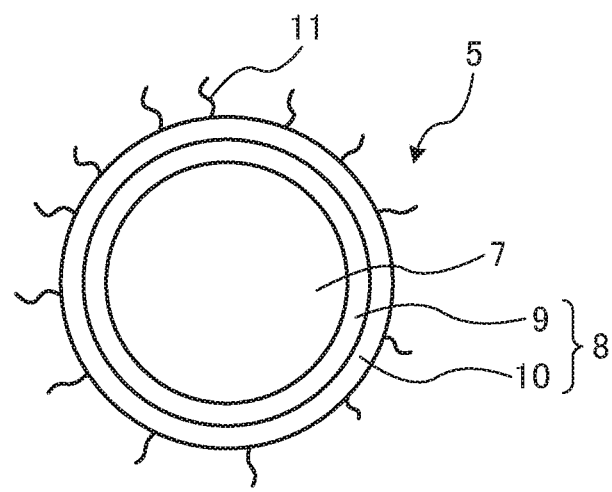
FIG. 2 is a schematic diagram of a quantum dot.

As shown in FIG. 2, the quantum dot 5 in the present invention has a core portion 7 including a semiconductor particle, and a shell portion 8 with which the circumference of the core portion 7 is coated. For example, CdSe is used for the core portion 7, but materials are not limited particularly. For example, it is possible to use a core material including at least Zn and Cd, core material including Zn, Cd, Se and S, ZnCuInS, ZnSe, ZnS, CdS, CdSe, InP, CdTe, mixtures of some thereof, and the like.

The shell portion 8 protects the core portion 7 as a fluorescent portion. As shown in FIG. 2, the shell portion 8 is comprised of two-layer structure, and in other words, is of the so-called multi-shell structure having a first shell portion (shell I) 9 with which the surface of the core portion 7 is coated, and a second shell portion (shell II) 10 with which the surface of the first shell portion 9 is coated. It is suitable that the shell portion 8 thus has two or more layers, but one layer may be adopted. In such a case, the shell portion 8 is comprised of one layer of the second shell portion 10. In addition, in the present invention, it is possible to provide a one-layer structure controlled so that the composition ratio inside the shell portion gradually changes with distance from the core portion 7, and the like.

For example, a band gap of the second shell portion 10 is made larger than a band gap of the first shell portion 9, but the invention is not limited thereto.

Materials are not limited particularly, and for example, the first shell portion 9 is formed of ZnCdS, while the second shell portion 10 is formed of ZnS.

As shown in FIG. 2, many organic ligands 11 coordinate to the surface (surface of the second shell portion 10) of the quantum dot 5. By this means, it is possible to suppress coagulation of quantum dots 5, and it is possible to improve dispersion characteristics of the quantum dots 5 inside the resin 6. Materials of the ligands are not limited particularly, and examples thereof are octadecene, octadecane, trioctyiphosphine (TOP), trialkyl phosphine oxide, alkylamine, dialkylamine, trialkylamine, alkylphosphonic acid and the like.

Alternatively, the quantum dot 5 may be comprised of only the core portion 7 including the semiconductor particle, without the shell portion 8 being formed. In other words, as long as the quantum dot 5 is provided with at least the core portion 7, the quantum dot 5 does not need to be provided with a coating structure by the shell portion. For example, when the core portion is coated with the shell portion, there is a case where the region as the coating structure is small or coating portion is too thin, and it is not possible to analyze and confirm the coating structure. Accordingly, irrespective of the presence or absence of the shell portion by analysis, it is possible to judge as the quantum dot 5.

Figure 1B:
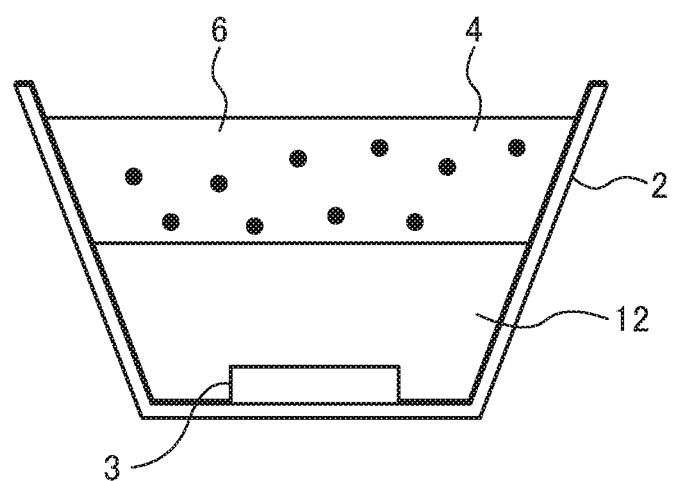

As shown in FIG. 1B, a resin layer 12 without quantum dots 5 being mixed may exist between the LED chip 3 and the fluorescent layer 4. The resin used for the resin layer 12 and the resin 6 used for the fluorescent layer 4 may be made of the same material or different materials. When the resin layer 12 is made different from the resin 6 used for the fluorescent layer 4, for example, a resin with high thermal conductivity is disposed in the resin layer 12, and the resin 6 that enables dispersion characteristics of the quantum dot 5 to be improved is selected for the fluorescent layer 4. As one example, the resin layer 12 is formed of a silicone resin, and the resin 6 used for the fluorescent layer 4 is formed of an epoxy resin. Further, when the resin layer 12 and the resin 6 used for the fluorescent layer 4 is formed of the same resin, it is possible to use an epoxy resin, silicone resin and the like for both the resin layer 12 and the fluorescent layer 4.

Figure 3:
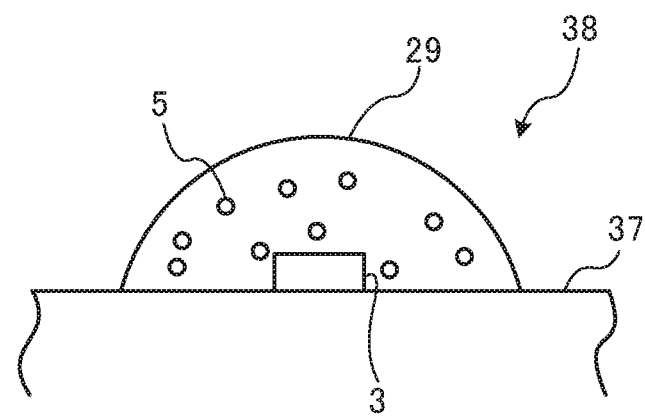
FIG. 3 is a schematic diagram of another LED apparatus (light emitting apparatus)

FIG. 3 is a schematic diagram of another LED apparatus (light emitting apparatus). In an LED apparatus (light emitting apparatus) 38 shown in FIG. 3, the LED chip (light emitting device) 3 is installed on a substrate 37, and a fluorescent layer 29 is formed over the upper surface (light emitting surface) of the LED chip 3 and the upper surface of the substrate 37. As shown in FIG. 3, the fluorescent layer 29 includes the quantum dots 5.

In the LED apparatus (light emitting apparatus) 38 shown in FIG. 3, as distinct from FIGS. 1A and 1B, without providing the case-shaped storage portion to store the LED chip and fluorescent layer, the fluorescent layer 29 is formed on the LED chip 3 installed on the substrate 37 by potting processing and the like.

In FIG. 3, the surface of the fluorescent layer 29 is in the shape of a dome. For example, a dent portion may be formed on the surface, the shape may be rectangular, and thus, the shape is not limited particularly.

Figure 4:
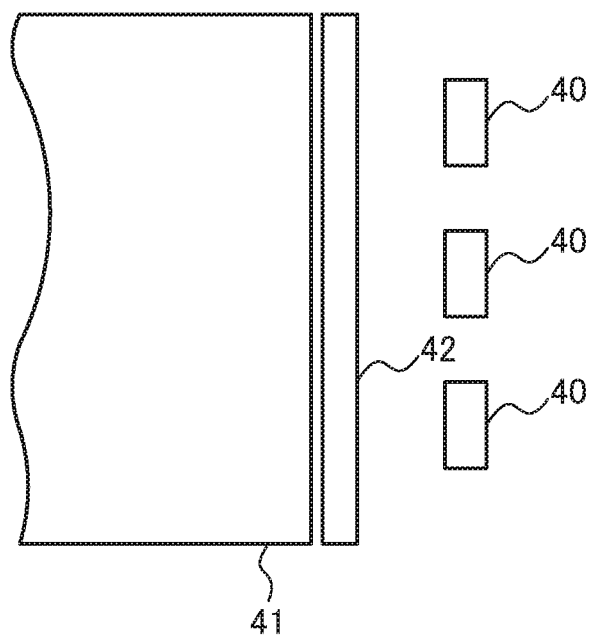
FIG. 4 is a schematic diagram of a resin compact provided with quantum dots.

FIG. 4 is a schematic diagram of a resin compact provided with quantum dots. In FIG. 4, a bar-shaped wavelength conversion member 42 exists between light emitting devices 40 such as LEDs and a light guide plate 41. In this Embodiment, a resin including quantum dots is formed in the shape of a bar or rod to constitute the wavelength conversion member 42 shown in FIG. 4. Light emitted from the light emitting device 40 is subjected to wavelength conversion in the wavelength conversion member 42, and the light subjected to wavelength conversion is output to the light guide plate 41. For example, the wavelength conversion member 42 includes each of quantum dots with fluorescent wavelengths of 520 nm (green) and 660 nm (red). Then, a part of blue photons emitted from the light emitting device 40 is converted into green or red by each of quantum dots, and white light is thereby output from the wavelength conversion member 42 to the light guide plate 41.

Figure 5:
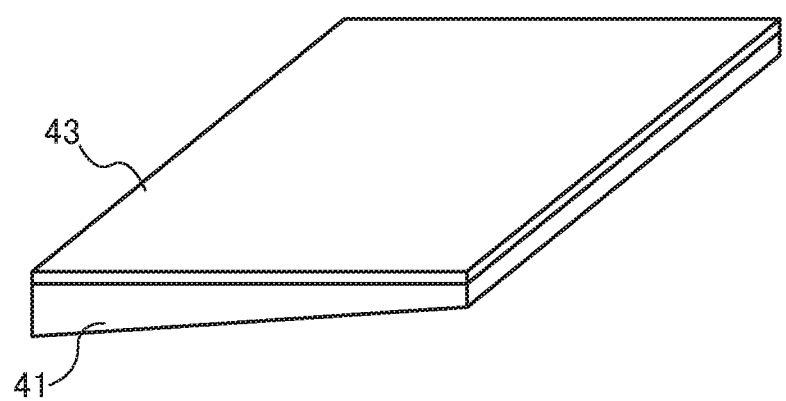
FIG. 5 is a perspective diagram of a resin formed sheet provided with quantum dots.

In FIG. 5, on the light emitting surface of the light guide plate 41 is provided a wavelength conversion sheet 43 formed by using a resin including quantum dots. In this Embodiment, the wavelength conversion sheet 43 may be applied and formed onto the light guide plate 41, or may be beforehand formed in the shape of a sheet to be stacked on the light emitting surface of the light guide plate 41. Further, another film such as a diffusion film may be disposed between the light guide plate 41 and the wavelength conversion sheet 43.

Further, it is also possible to form the light guide plate 41 itself by using a resin including quantum dots. In this case, the wavelength conversion sheet 43 may exist or may not exist. Both the light guide plate 41 and the wavelength conversion sheet 43 are capable of including quantum dots that emit green light and quantum dots that emit red light. Furthermore, it is also possible that the light guide plate 41 includes quantum dots that emit green light, and that the wavelength conversion sheet 43 includes quantum dots that emit red light. Alternatively, conversely, it is also possible that the light guide plate 41 includes quantum dots that emit red light, and that the wavelength conversion sheet 43 includes quantum dots that emit green light.

Figure 6A:
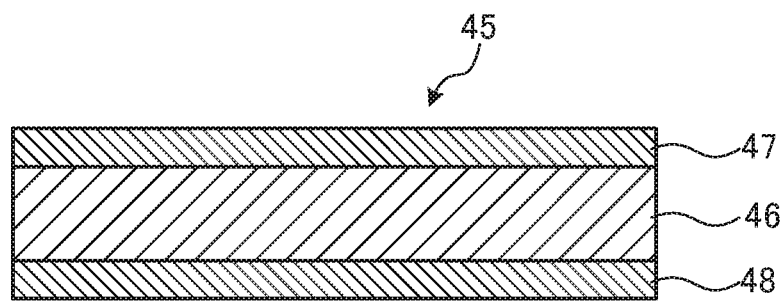
FIG. 6A is a longitudinal sectional diagram of a sheet member provided with quantum dots and FIGS. 6B and 6C are schematic diagrams of application using the sheet member.
Figure 6B:
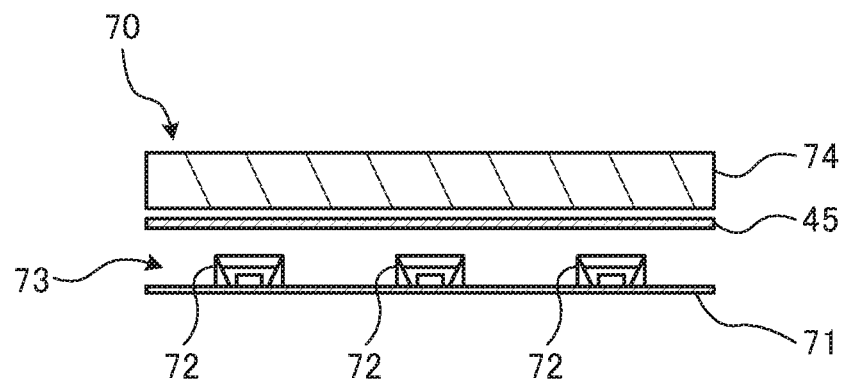
Figure 6C:
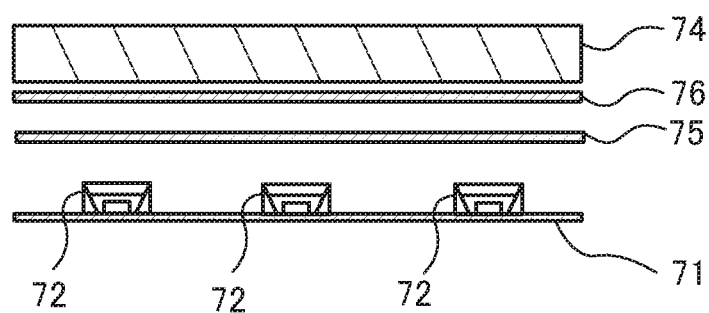

FIG. 6A is a longitudinal sectional diagram of a sheet member provided with quantum dots and FIGS. 6B and 6C are schematic diagrams of application using the sheet member. A sheet member 45 has a quantum dot layer 46 having quantum dots, and barrier layers 47, 48 formed on the opposite sides of the quantum dot layer 46 to be comprised thereof. Generally, the "sheet" is regarded as a configuration where its thickness is thin with respect to the length and width. The presence or absence of flexibility of the sheet member 45 is not required, but it is suitable that the sheet has flexibility. The sheet member 45 may sometimes be called simply a sheet, or may be called a film, film sheet or the like.

As shown in FIG. 6A, the barrier layers 47, 48 are disposed on the opposite sides of the quantum dot layer 46, respectively. An adhesive layer may be included between the quantum dot layer 46 and each of the barrier layers 47, 48, and in this Embodiment, it is possible to form the barrier layers 47, 48 brought into contact with the both surfaces of the quantum dot layer 46. By thus providing the barrier layers 47, 48, the both surfaces of the quantum dot layer 46 are protected, and it is possible to improve environmental resistance (durability).

Each of the barrier layers 47, 48 is formed of a single layer of an organic layer, or laminate structure of an organic layer and inorganic layer. As the organic layer, it is possible to exemplify a PET (polyethylene terephthalate) film. Further, as the inorganic layer, it is possible to exemplify a $SiO_2$ layer. Alternatively, the inorganic layer may be a layer of silicon nitride ($SiN_x$), aluminium oxide ($Al_2O_3$), titanium oxide ($TiO_2$), or silicon oxide ($SiO_2$), or a laminate thereof.

The sheet member 45 including quantum dots is capable of being incorporated into a backlight apparatus 73 shown in FIG. 6B, for example. In FIG. 6B, the backlight apparatus 73 is comprised by having a plurality of light emitting devices 72 (LEDs) and the sheet member 45 opposed to the light emitting devices 72. As shown in FIG. 6B, each of the light emitting devices 72 is supported on the surface of a support body 71. In FIG. 6B, the backlight apparatus 73 is disposed on the back side of a display section 74 such as a liquid crystal display, thereby constituting a display apparatus 70.

In addition, although not shown in FIG. 6B, as well as the sheet member 45, a diffusion plate that diffuses light, another sheet and the like may exist between the light emitting devices 72 and the display section 74.

Further, the sheet member 45 is formed of a single sheet, and for example, a plurality of sheet members 45 may be joined to be a predetermined size. Hereinafter, the configuration where a plurality of sheet members 45 is joined by tiling is referred to as a composite sheet member.

In FIG. 6C, components are disposed in the order of light emitting devices 72/composite sheet member 75/diffusion plate 76/display section 74. By this means, even when unevenness of an emitted color caused by diffuse reflection, deterioration of quantum dots by water vapor entering from a joint or the like occurs in the joint of sheet members constituting the composite sheet member 75, it is possible to suitably suppress that color unevenness occurs in display of the display section 74. In other words, the light released from the composite sheet member 75 is diffused by the diffusion plate 76, and then, is input to the display section 74, and it is thereby possible to suppress color unevenness in display in the display section 74.

Figure 7A:
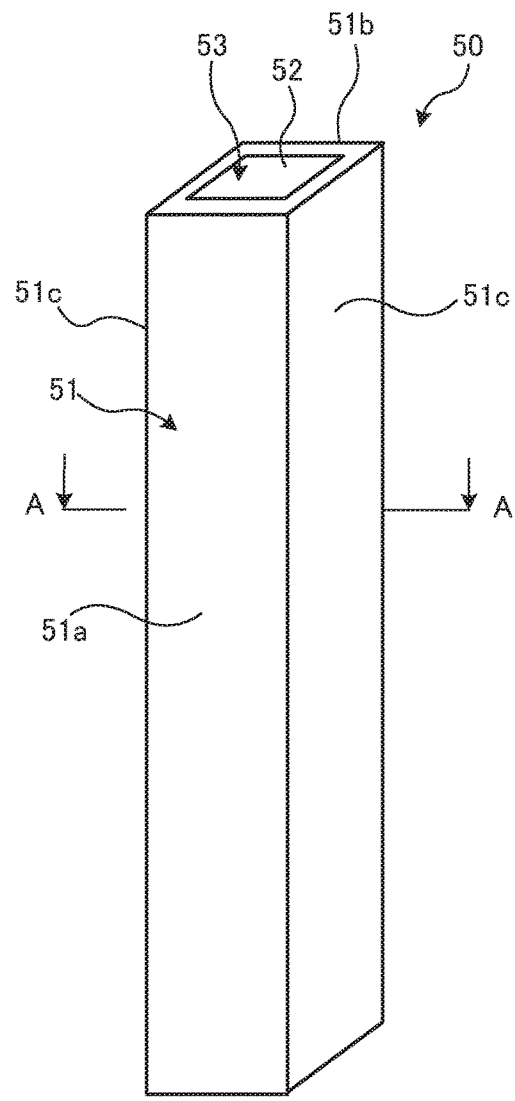
FIG. 7A is a perspective diagram of a wavelength conversion member provided with quantum dots and FIG. 7B is a cross-sectional diagram along arrows A-A.
Figure 7B:
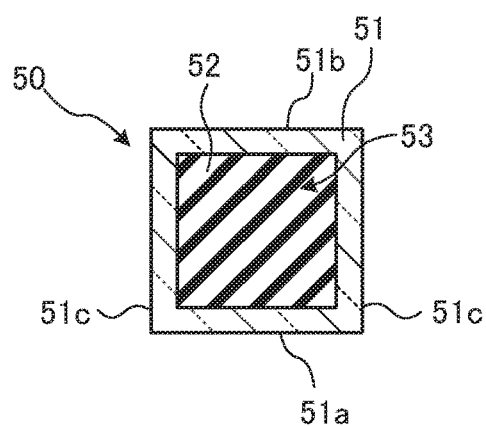

FIG. 7A is a perspective diagram of a wavelength conversion member provided with quantum dots and FIG. 7B is a cross-sectional diagram along arrows A-A. FIG. 7A is the perspective diagram of the wavelength conversion member, and FIG. 7B is the cross-sectional diagram of the wavelength conversion member shown in FIG. 7A taken along line A-A in the plane direction, viewed from the arrow direction.

As shown in FIG. 7A, the wavelength conversion member 50 has a container 51, and a compact 52 including a wavelength conversion substance to be comprised thereof.

The container 51 is provided with storage space 53 capable of storing the compact 52 including the wavelength conversion substance to hold. It is preferable that the container 51 is a transparent member. "Transparent" refers to a member generally regarded as being transparent, or a member in which visible light transmittance is about 50% or more.

Horizontal and vertical dimensions of the container 51 range from about several millimeters to several tens of millimeters, and horizontal and vertical dimensions of the storage space 53 range from about several hundreds of micrometers to several millimeters.

As shown in FIGS. 7A and 7B, the container 51 is provided with a light input surface 51a, light output surface 51b, and side surfaces 51c connecting between the light input surface 51a and the light output surface 51b. As shown in FIGS. 7A and 7B, the light input surface 51a and the light output surface 51b are in a position relationship where the surfaces are opposed to each other.

As shown in FIGS. 7A and 7B, in the container 51, the storage space 53 is formed on the inner side of the light input surface 51a, the light output surface 51b and the side surface 51c. In addition, a part of the storage space 53 may reach the light input surface 51a, the light output surface 51b or the side surface 51c.

The container 51 shown in FIGS. 7A and 7B is a container formed of a glass tube, for example, and it is possible to exemplify a glass capillary. In addition, as long as it is possible to form a container with excellent transparency as described above, the container may be made of a resin or the like.

As shown in FIGS. 7A and 7B, in the storage space 53 is disposed the compact 52 including the wavelength conversion substance. As shown in FIGS. 7A and 7B, the storage space 53 is open, and it is possible to insert the compact 52 including the wavelength conversion substance therefrom.

It is possible to insert the compact 52 including the wavelength conversion substance into the storage space 53 by means such as injection and adhesion. In the case of injection, the compact 52 including the wavelength conversion substance is formed in the completely same size as that of the storage space 53, or is formed to be slightly larger than the storage space 53, and by inserting the compact 52 including the wavelength conversion substance into the storage space 53, while applying pressure, it is possible to suppress the fact that gaps occur not only inside the compact 52 including the wavelength conversion substance, but also between the compact 52 including the wavelength conversion substance and the container 51.

Further, in the case of bonding the compact 52 including the wavelength conversion substance to the inside of the storage space 53 to fix, the compact 52 including the wavelength conversion substance is formed to be smaller than the storage space 53, and in a state in which an adhesive layer is applied to the side surfaces of the compact 52 including the wavelength conversion substance, is inserted into the storage space 53. At this point, the cross-sectional area of the compact 52 may be slightly smaller than the cross-sectional area of the storage space 53. By this means, the compact 52 including the wavelength conversion substance and the container 51 are brought into intimate contact with each other via the adhesive layer, and it is possible to suppress the fact that gaps are formed between the compact 52 including the wavelength conversion substance and the container 51. As the adhesive layer, it is possible to use the same resin as the compact 52, or a resin that the basic structure is common to the compact 52. Further, as the adhesive layer, a transparent adhesive may be used.

Furthermore, it is preferable that a refractive index of the compact 52 including the wavelength conversion substance is smaller than a refractive index of the container 51. By this means, a part of the light entering into the compact 52 including the wavelength conversion substance is totally reflected by side wall portions of the container 51 facing the storage space 53. This is because an incident angle on the medium side with a low refractive index is larger than an incident angle on the medium side with a high refractive index. By this means, it is possible to decrease an amount of light leaking from the side to the outside of the container 51, and it is thereby possible to enhance color conversion efficiency and light emission intensity.

A light emitting device is disposed on the light input surface 51a side of the wavelength conversion member 50 shown in FIGS. 7A and 7B. Further, the light guide plate 40 shown in FIG. 4 and the like are disposed on the light output surface 51b side of the wavelength conversion member 50. In addition, FIGS. 7A and 7B illustrates the compact 52, and a quantum dot layer may be formed by injecting a resin composition including quantum dots.

Figure 8:
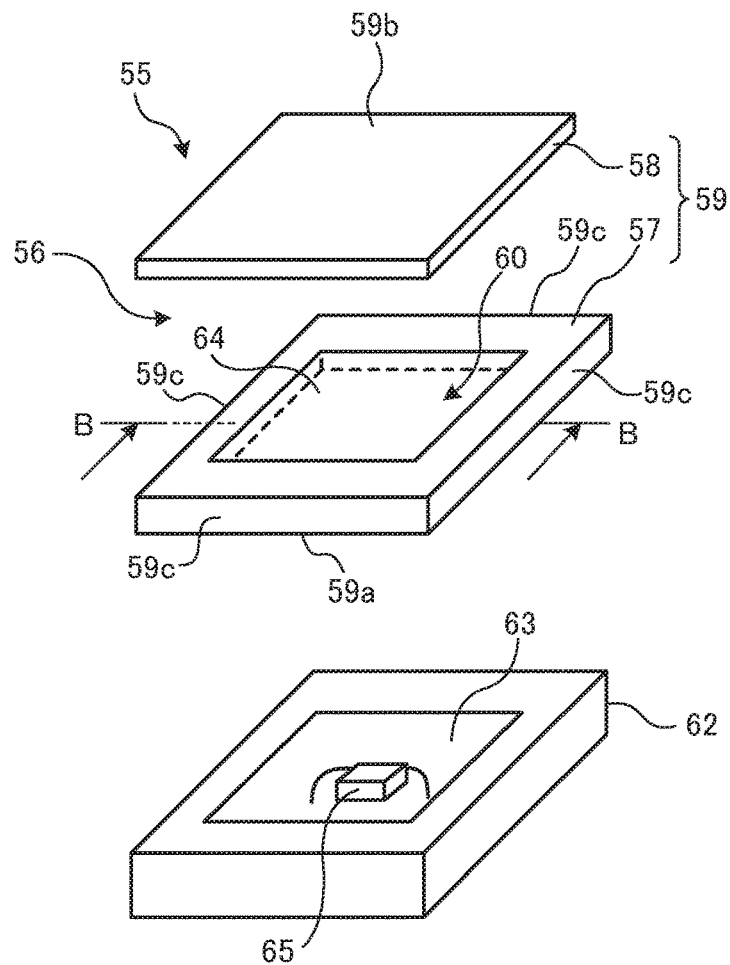
FIG. 8 is a perspective diagram of a light emitting device comprised by having a wavelength conversion member provided with quantum dots.
Figure 9:
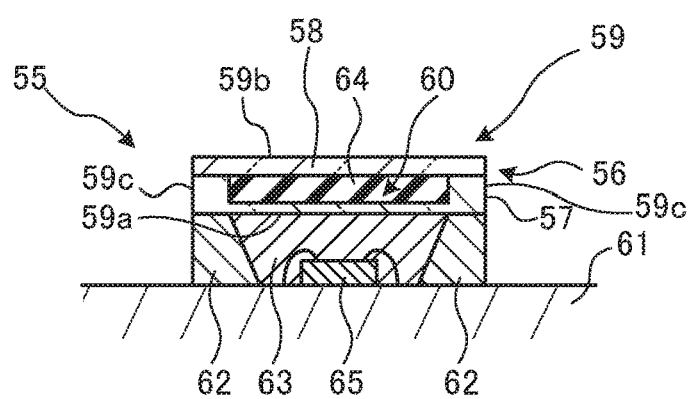
FIG. 9 is a longitudinal sectional diagram taken along line B-B in the height direction viewed from the arrow direction in a state in which each component of the light emitting device shown in FIG. 8 is combined.

FIG. 8 is a perspective diagram of a light emitting device having a wavelength conversion member provided with quantum dots to be comprised thereof. FIG. 9 is a longitudinal sectional diagram taken along line B-B in the height direction viewed from the arrow direction in a state in which each component of the light emitting device shown in FIG. 8 is combined.

The light emitting device 55 shown in FIGS. 8 and 9 has a wavelength conversion member 56 and LED chip (light emitting section) 65 to be comprised thereof. The wavelength conversion member 56 is provided with a container 59 comprised of a plurality of pieces including a container main body 57 and a lid body 58. Further, as shown in FIG. 8, in the center portion of the container main body 57 is formed storage space 60 with the bottom. In the storage space 60 is provided a wavelength conversion layer 64 including quantum dots. The wavelength conversion layer 64 may be a compact, or may be filled inside the storage space 60 by potting processing and the like. Then, the container main body 57 and lid body 58 are joined via an adhesive layer.

A light input surface 59a is a lower surface of the container 59 of the wavelength conversion member 56 shown in FIGS. 8 and 9. A light output surface 59b is an upper surface opposite the light input surface 59a. The storage space 60 is formed in a position on the inner side with respect to each side surface 59c provided in the container 59 of the wavelength conversion member 56 shown in FIGS. 8 and 9.

As shown in FIG. 9, the LED chip 65 is connected to a printed wiring board 61, and as shown in FIGS. 8 and 9, the circumference of the LED chip 65 is enclosed with a frame body 62. Then, the inside of the frame body 62 is sealed with a resin layer 63.

As shown in FIG. 9, the wavelength conversion member 56 is joined to the upper surface of the frame body 62 via an adhesive layer not shown, and the light emitting device 55 such as an LED is thereby comprised.

The quantum dot of this Embodiment has the following features. In other words, in the quantum dot of Embodiment 1, in a TG-DTA (Thermogravimetry•Differential Thermal Analysis) profile, a weight reduction up to 490° C. is within 75%. In this way, in Embodiment 1, organic residues adhering to the surface of the quantum dot are evaluated by the weight reduction (TG). As shown in experiments described later, it has been understood that the weight reduction of a quantum dot of Comparative Example is about 90% or more up to 490° C. In other words, organic residues with a weight about nine times the quantum dot itself adhere to the surface of the quantum dot of the Comparative Example. In contrast thereto, in the quantum dot in Embodiment 1, the weight reduction up to 490° C. is within 75%, and organic residues adhering to the surface of the quantum dot are fewer than those of the Comparative Example.

Embodiment 2 provides a quantum dot that oleylamine (OLA) is not observed in GC-MS qualitative analysis at 350° C. Thus, in Embodiment 2, organic residues adhering to the surface of the quantum dot are evaluated by qualitative analysis at 350° C., and herein, 350° C. is a temperature at which an abrupt weight change started to occur in TG-DTA. Further, in the quantum dot of Embodiment 2, it is preferable that trioctylphosphine (TOP) is not observed in GC-MS qualitative analysis at 350° C. On the other hand, as shown in experiments described later, oleylamine (OLA) and trioctylphosphine (TOP) were observed in GC-MS qualitative analysis of the quantum dot of the Comparative Example.

For the quantum dot, at least one of the above-mentioned TG-DTA and GC-MS qualitative analysis is performed, and it is essential only that the weight reduction up to 490° C. is within 75% in a TG-DTA profile, or that oleylamine (OLA) is not observed in GC-MS qualitative analysis at 350° C. In other words, when the condition of the above-mentioned Embodiment 1 is satisfied, satisfaction of the condition of Embodiment 2 is not a requirement. Similarly, when the condition of the above-mentioned Embodiment 2 is satisfied, satisfaction of the condition of Embodiment 1 is not a requirement. In addition, in the case where both of the above-mentioned TG-DTA and GC-MS qualitative analysis are performed on a quantum dot, the weight reduction up to 490° C. is within 75% in a TG-DTA profile, and oleylamine (OLA) is not observed in GC-MS qualitative analysis at 350° C., it is possible to decrease organic residues adhering to the surface of the quantum dot more reliably, and such a case is suitable.

In this Embodiment, by configuring a fluorescent layer of a light emitting apparatus using quantum dots with few organic residues adhering to the surface, it is possible to effectively suppress the occurrence of black discoloration inside the fluorescent layer positioned immediately above the light emitting device, and to enhance luminous efficiency.

Figure 10:
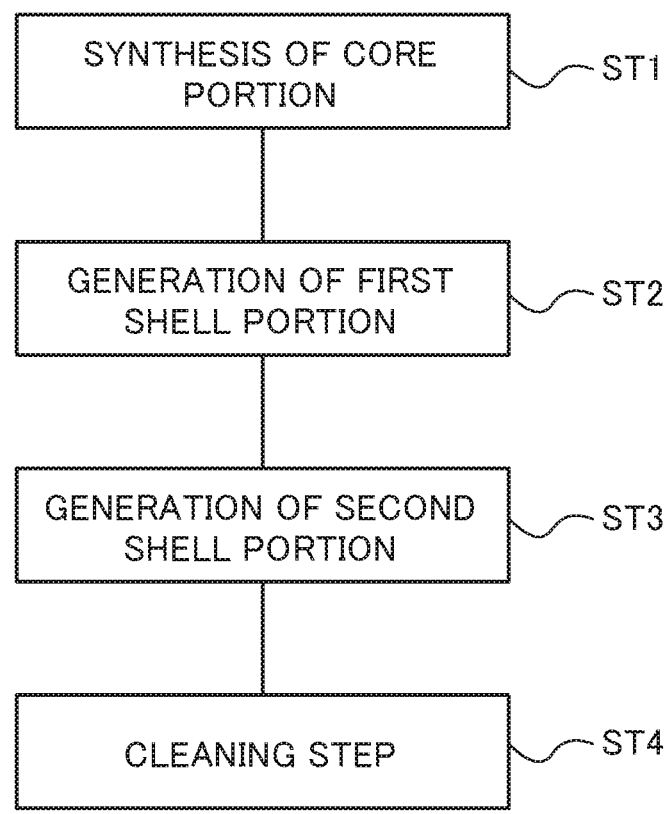
FIG. 10 is a flowchart illustrating a method of manufacturing a quantum dot.

For example, the quantum dot of the present invention is manufactured by steps as shown in FIG. 10. FIG. 10 is a flowchart illustrating a method of manufacturing the quantum dot.

In step ST1 shown in FIG. 10, the core portion 7 is synthesized. For example, formed is the core portion 7 made of ZnCdSeS synthesized by reacting raw materials obtained by preparing an Se source, Cd source, Zn source, S source and the like by a micro-reactor method.

Next, in step ST2 shown in FIG. 10, the surface of the core portion 7 is coated with the first shell portion 9. For example, the surface of the core portion 7 is coated with the first shell portion 9 made of ZnCdS synthesized by reacting raw materials obtained by preparing an S source, Cd source, Zn source and the like by a continuous injection method.

Next, in step ST3 shown in FIG. 10, the surface of the first shell portion 9 is coated with the second shell portion 10. For example, the surface of the first shell portion 9 is coated with the second shell portion 10 made of ZnS synthesized by reacting ZnS materials by the continuous injection method.

For example, as the Zn source, used as an example are zinc oxide, oleic acid, 1-octadecene and oleylamine (OLA). As a substitute for zinc oxide, it is possible to use $[(CH_3)_2NCSS]_2Zn$, $[(C_2H_5)_2NCSS]_2Zn$, $C_2H_5ZnS_2CN(C_2H_5)_2$, $Cd[S_2CNCH_3(C_6H_5)]_2$ and the like. Alternatively, in the case of coating of ZnSe, it is possible to use $Zn[Se_2CNCH_3(C_6H_5)]_2$ and the like. In the case of forming one of the shell portions 9 and 10, one of steps ST2 and ST3 is selected. Further, in the case where the shell portions 9 and 10 are not formed, steps ST2 and ST3 are not selected.

Next, in step ST4 shown in FIG. 10, a quantum dot solution obtained as described above is cleaned. In a cleaning step, an undiluted solution of quantum dots is mixed into solvents such as toluene and ethanol, and the quantum dots and solvents are subjected to centrifugation with a centrifuge. Then, the solvents are discharged to obtain the cleaned quantum dots.

Figure 11:
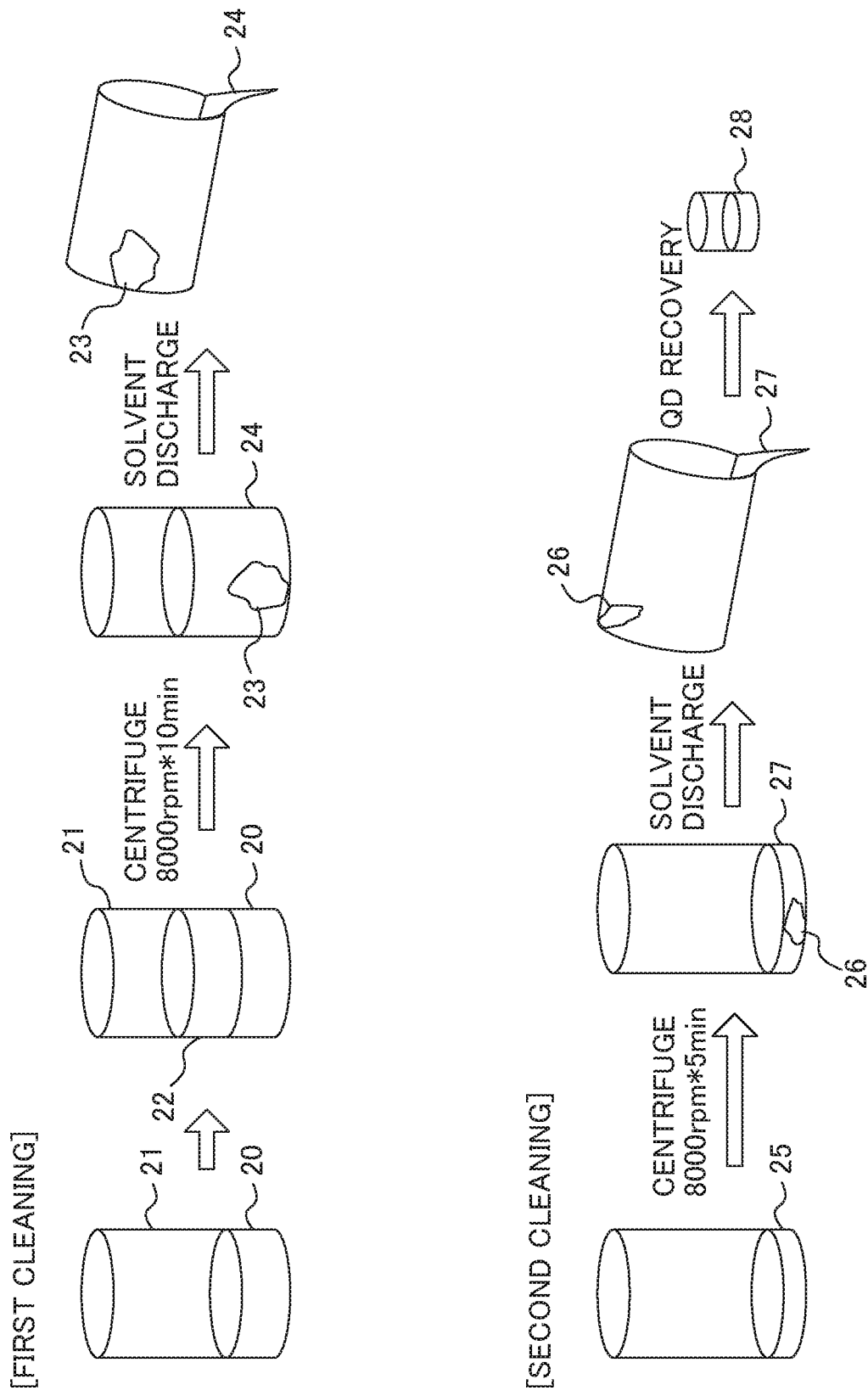
FIG. 11 is a schematic diagram illustrating a first method of cleaning the quantum dot.

FIG. 11 is a schematic diagram illustrating a first method of cleaning the quantum dot in the present invention. In the first cleaning method shown in FIG. 11, used is a centrifuge capable of applying a centrifugal force of about several thousands of G.

First, in the first cleaning, a solvent 22 is poured in a container 21 including an undiluted solution (referred to as "QD undiluted solution") of quantum dots generated through steps ST1 to ST3 shown in FIG. 10. The solvent 22 is alcohols, ketone, toluene and the like.

Next, the mixed solution of the QD undiluted solution and solvent 22 is applied to the first-time centrifuge. At this point, for example, the centrifugal force of 8,000 rpm is caused to act for 10 minutes. By this means, it is possible to properly separate the quantum dot 23 and the solvent 24 by centrifugation. Then, the solvent 24 is discharged.

Next, the second cleaning is performed. First, a solvent 25 is mixed into the quantum dot cleaned as described above, and at this point, it is possible to make an amount of the solvent 25 to pour smaller than an amount of the solvent 22 poured in the first cleaning. Then, the resultant is subjected to the second-time centrifuge. For example, the centrifugal force of 8,000 rpm is caused to act for 5 minutes. By this means, it is possible to properly separate the quantum dot 26 and the solvent 27 by centrifugation. Then, the solvent 27 is discharged.

The quantum dot thus obtained through a plurality of cleanings is recovered to obtain a quantum dot concentrated solution (referred to as QD concentrated solution) 28 dispersed in ODE, for example.

Figure 12:
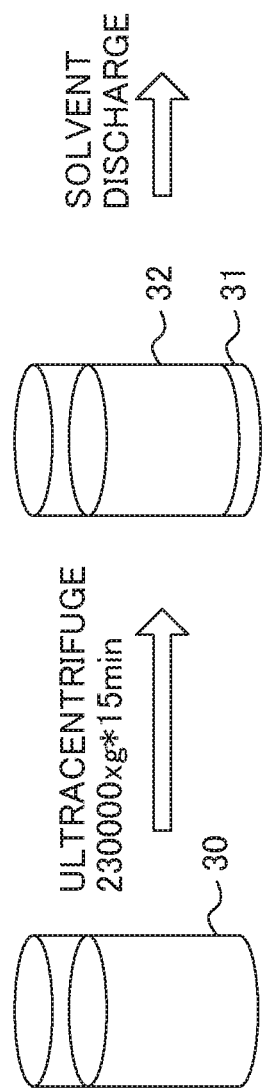
FIG. 12 is a schematic diagram illustrating a second method of cleaning the quantum dot.

FIG. 12 is a schematic diagram illustrating a second method of cleaning the quantum dot. In the second cleaning method shown in FIG. 12, used is an ultracentrifuge capable of applying a centrifugal force of several tens of thousands of G or more.

In FIG. 12, a QD undiluted solution 30 is applied to the ultracentrifuge. At this time, for example, the centrifugal force of 230,000×g is caused to act for 15 minutes. By this means, it is possible to separate the quantum dot 31 and the solvent 32 by centrifugation. Then, the solvent 32 is discharged. The quantum dot obtained through cleaning by the ultracentrifuge is recovered to obtain a QD concentrated solution. The ultracentrifuge is used in cleaning in FIG. 12, and as the number of revolutions, 40,000 rpm or more is preferable.

In this Embodiment, by applying the cleaning step using a centrifuge (preferably ultracentrifuge) to the quantum dot, it is possible to effectively remove unnecessary organic residues adhering (adsorbed) to the surface of the quantum dot.

Further, in the above-mentioned description, the cleaning step is applied, after the synthesis of the core portion (step ST1), formation of the first shell portion (step ST2) and formation of the second shell portion (step ST3), and it is also possible to perform cleaning for each step.

In other words, after the synthesis of the core portion, solvents such as toluene and ethanol are poured into a container with an undiluted solution of the core portion put therein, and the resultant is stirred, shaken and mixed. Then, centrifugation is performed to precipitate and recover the core portion. Subsequently, a supernatant solution is removed, and after drying, for example, octadecene (ODE) is added to perform re-dispersion. When re-dispersion is hard to perform, ultrasonic is applied.

Successively, after the formation of the first shell portion, a solvent such as toluene is poured into a container with an undiluted solution of the quantum dot put therein, and the resultant is stirred, shaken and mixed. Subsequently, a solid of a by-product and the like is precipitated from the mixed solution, and for example, the quantum dot is extracted to toluene. Then, supernatant toluene including the quantum dot is recovered, and is concentrated using an evaporator. Again, a solvent such as ethanol is poured, the resultant is stirred, shaken and mixed, and after discarding a supernatant solution, centrifugation is performed to precipitate and recover the quantum dot. Successively, a supernatant solution is removed, and after drying, for example, octadecene (ODE) is added to perform re-dispersion. When re-dispersion is hard to perform, ultrasonic is applied.

Next, after the formation of the second shell portion, the resultant is concentrated using the evaporator. Successively, a solvent such as toluene is poured, stirred and shaken, a solvent such as ethanol is poured, stirred and shaken, and a supernatant solution is removed. Then, centrifugation is performed to precipitate and recover the quantum dot. Successively, a supernatant solution is removed, and after drying, for example, toluene is added to perform re-dispersion. When re-dispersion is hard to perform, ultrasonic is applied. In addition, when the amount is large and centrifugation is hard to apply, spontaneous precipitation may be performed.

According to the quantum dot obtained by the above-mentioned manufacturing method, it is possible to make the weight reduction from 50° C. to 490° C. within 75% in a TG-DTA ((Thermogravimetry•Differential Thermal Analysis) profile. Further, as described above, the Zn source in generating the quantum dot of the present invention includes oleylamine (OLA), but according to the quantum dot obtained by the above-mentioned manufacturing method, the oleylamine (OLA) is not observed in GC-MS qualitative analysis at 350° C. Accordingly, by the cleaning step using the centrifuge, it is possible to effectively remove organic residues including the oleylamine (OLA) adhering to the surface of the quantum dot 5.

By dispersing the quantum dot 5 that organic residues on the surface are suitably removed, for example, in the fluorescent layer 4 shown in FIG. 1A or 1B, when the LED chip 3 emits light, it is possible to effectively suppress the black discoloration occurrence inside the fluorescent layer 4 positioned immediately above the LED chip 3, and to improve luminous efficiency. Accordingly, according to this Embodiment, it is possible to obtain the light emitting apparatus without black discoloration occurring. The black discoloration occurs in the fluorescent layer 4 including the quantum dot 5 positioned immediately above the LED chip 3, and as the reason why the black discoloration occurs, the cause is considered the effect of light, heat or both from the LED chip 3 on the quantum dot including a large amount of organic residues in the conventional technique.

Further, by dispersing the quantum dot 5 that organic residues on the surface are suitably removed in the fluorescent layer 29 shown in FIG. 3, the wavelength conversion member 42 shown in FIG. 4, the wavelength conversion sheet 43 shown in FIG. 5, the quantum dot layer 46 shown in FIG. 6A, the compact 52 shown in FIGS. 7A and 7B and the wavelength conversion layer 64 shown in FIG. 8, as in the case of FIG. 1A or 1B, it is possible to enhance the effect of suppressing the black discoloration occurrence and to suitably improve luminous efficiency.

Herein, the fact that "black discoloration does not occur" in the present Description refers to the fact that deterioration of light emission intensity at an emission wavelength indicative of a peak in an emission spectrum of a light emitting apparatus is suppressed within 30% after a lighting test of the light emitting apparatus, as compared with before the test. As the lighting test, for example, light emission intensity is measured after performing lighting at 85° C. for 1000 hours, and it is possible to compare with intensity when black discoloration does not occur immediately before the durability test. In other words, after performing the lighting test of the light emitting apparatus at 85° C. for 1000 hours, when deterioration of light emission intensity at an emission wavelength indicative of a peak in an emission spectrum of the light emitting apparatus is suppressed within 30% as compared with before the test, it is recognized that black discoloration does not occur. As an example, in the LED apparatus 38 using the LED chip 3 that emits blue light, the quantum dot 5 that emits green light, and the quantum dot 5 that emits red light, when the light emission test is performed at 85° C. for 1000 hours, in the case where it is possible to suppress deterioration of light emission intensity at a peak wavelength of each of RGB after the test is all suppressed within 30% as compared with the light emission intensity at each of the same wavelengths before the test, the case is referred to as that the black discoloration does not occur.

As described above, as the cleaning step, the quantum dot and solvent are separated by centrifugation using the centrifuge or ultracentrifuge, and by the centrifugation, it is possible to effectively remove organic residues such as oleylamine (OLA) adhering to the surface of the quantum dot.

In the case of using the centrifuge described in FIG. 11, as the number of revolutions, it is preferable that the number is 7000 rpm or more (the centrifugal force is about 8300×g at 7000 rpm in H-9R made by KOKUSAN Co., Ltd.) Further, the time required for centrifugation is preferably 5 minutes or more. Furthermore, the number of times of centrifugation is preferably two or more.

Further, in the case of using the ultracentrifuge, it is preferable that the number of revolution is 40,000 rpm or more (230,000×g or more), and that the time required for centrifugation is 15 minutes or more. In the case of using the ultracentrifuge, the number of times of centrifugation is preferably one or more. In the case of using the ultracentrifuge, it is possible to decrease the total solvent amount and total cleaning time, and to result in reduction in manufacturing cost. Furthermore, it is possible to more effectively promote concentration precipitation of quantum dots, and it is expected to enhance the cleaning effect by the concentration precipitation. Still furthermore, it is possible to eliminate alien particle dots such that the particle diameter is extremely small and the like, it is possible to expect improvements in quantum yield (QY).

Example

The present invention will specifically be described below, using Examples performed to clarify the effects of the invention and Comparative Examples. In addition, the invention is not limited by the following Examples at all.

The core portion of the quantum dot used in experiments was formed of CdS, CdSe, ZnS, ZnSe or combination thereof using a micro-reactor method. The synthesis temperature was set at about 320° C., the flow rate of solution sending was set at about 320 μL/min, and the reaction time was set at 120 sec. In addition, the inner diameter (diameter)×length of the reaction section (capillary) was 320 μm×8 m.

Successively, the surface of the core portion was coated with the first shell portion using ZnCdS. Specifically, ZnCdS was formed by synthesis using raw materials obtained by preparing ODE, S source, Cd source, and Zn source by a continuous injection method. The set temperature was about 360° C., the flow rate of solution sending was set at about 400 μL/min (first stage), and about 800 μL/min (second stage), the solution sending amount of raw materials was set at about 5 mL (first time), and about 20 mL (second time), and the reaction time was set at about 13 minutes (first stage), about 250 minutes (second stage), and 5 minutes (annealing).

Successively, the surface of the first shell portion is coated with the second shell portion using ZnS. Specifically, ZnS was formed by synthesis using raw materials obtained by preparing TOP and ZnS raw materials by the continuous injection method. The set temperature was about 290° C., the flow rate of solution sending was set at about 800 μL/min, the solution sending amount was set at about 20 mL, and the reaction time was set at about 20 minutes.

Example

Cleaning shown in FIG. 11 was performed on quantum dots (green) with the above-mentioned core/multi-shell structure.
(Centrifuge)
Apparatus Name: H-9R made by KOKUSAN Co., Ltd.
Condition: 9500×g (8000 rpm)
Time: 10 minutes (first cleaning), 5 minutes (second cleaning)
The QD undiluted solution in the first cleaning was 50 mL, and as the solvent, 36 mL of toluene and 240 mL of ethanol were used. Further, in the second cleaning, as the solvent, 150 mL and 8 mL of ethanol was used. Then, quantum dots obtained via the cleaning step were dispersed in ODE to obtain a QD concentrated solution.

Comparative Example 1

As in the Example, cleaning using the centrifuge (H-9R made by KOKUSAN Co., Ltd.) was performed twice. In addition, the condition of the centrifuge and solvents were changed. In other words, in the first cleaning, the QD undiluted solution was 0.5 mL, and as the solvent, 9 mL of ethanol was used. Further, the condition of the centrifuge used in the first cleaning was set at 5400×g (5500 rpm), and the centrifugation time was set at 5 minutes. Furthermore, in the second cleaning, 9 mL of ethanol was used as the solvent, the condition of the centrifuge used in the second cleaning was set at 5400×g (5500 rpm), and the centrifugation time was set at 5 minutes. Then, quantum dots obtained via the cleaning step were dispersed in 0.5 mL of toluene to obtain a QD concentrated solution.

Comparative Example 2

Except that toluene used in the first cleaning in Example 1 was replaced with a solvent of dodecanthiol (DDT) (40%) and toluene (60%), the cleaning was performed as in Comparative Example 1.

In the Example, the dispersion state of quantum dots was excellent, there was no turbidity, and suspended matter•precipitate was not observed.

On the other hand, in Comparative Examples 1 and 2, the dispersion state of quantum dots was poor as compared with the Example, and further, turbidity and suspended matter•precipitate was observed.

Next, with respect to quantum dots respectively obtained via the cleaning steps of the above-mentioned Example and Comparative Examples 1 and 2, an organic substance amount remaining on the quantum dot surface was evaluated with a weight reduction (TG) by TG-DTA (Thermogravimetry•Differential Thermal Analysis) measurement.

Figure 13:
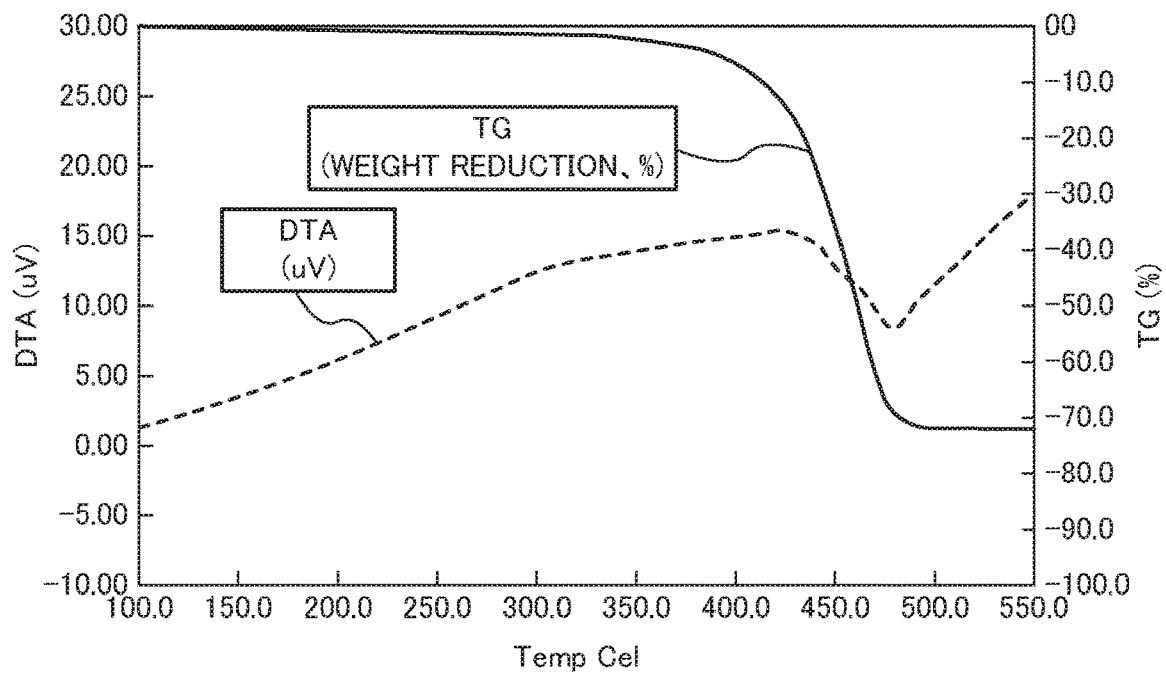
FIG. 13 is a TG-DTA profile of a quantum dot in the Example.
Figure 14:
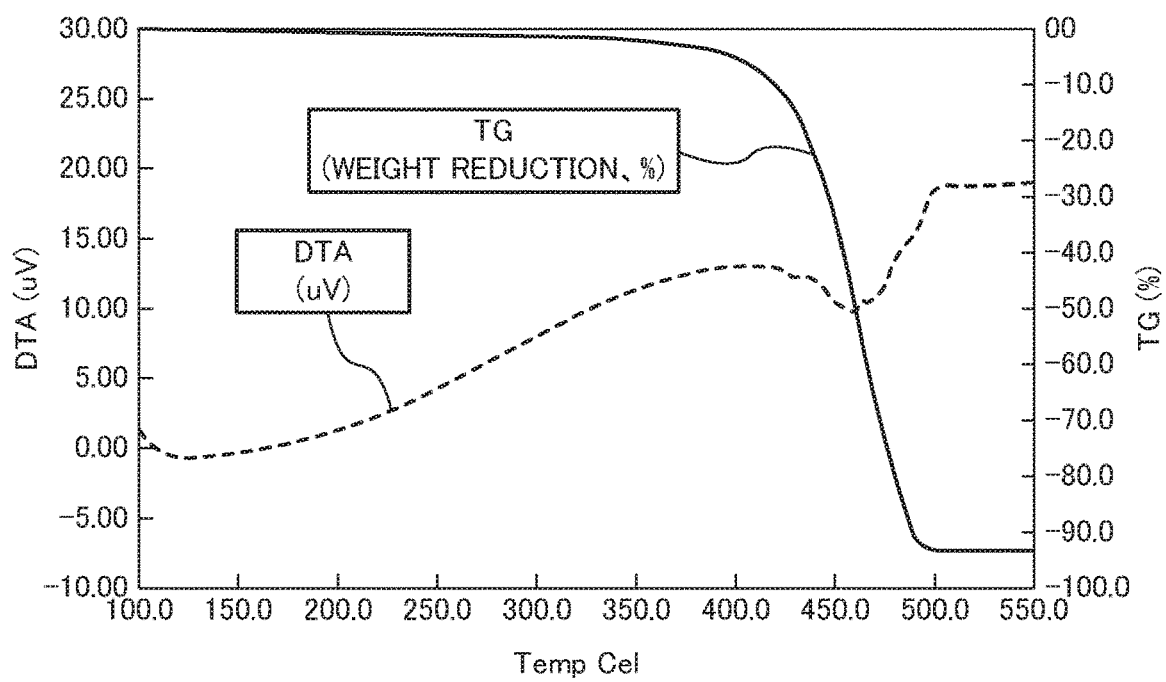
FIG. 14 is a TG-DTA profile of a quantum dot in Comparative Example 1.
Figure 15:
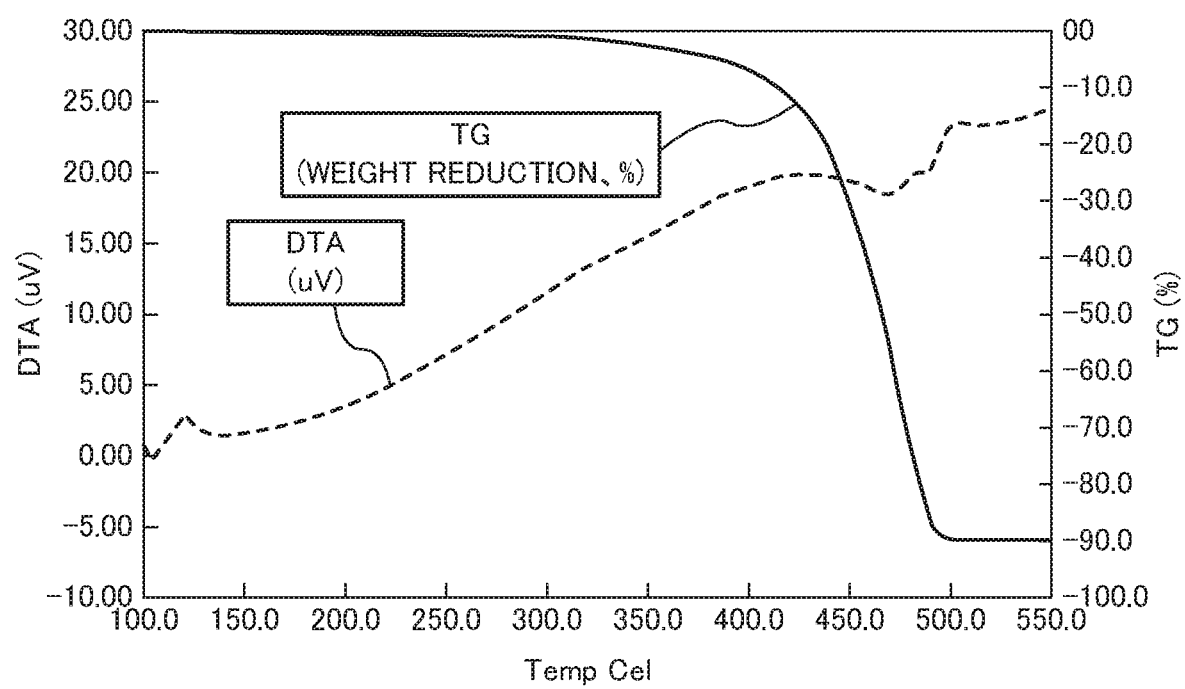
FIG. 15 is a TG-DTA profile of a quantum dot in Comparative Example 2.

(TG-DTA)
Apparatus name: TGDTA 6300 made by SII•Technology Kabushiki Kaisha
Atmosphere: In the air
Measurement temperature range: From 50° C. to 550° C.
Rate of temperature rise: 10° C./min FIG. 13 is a TG-DTA profile of the quantum dot in the Example, FIG. 14 is a TG-DTA profile of the quantum dot in Comparative Example 1, and FIG. 15 is a TG-DTA profile of the quantum dot in Comparative Example 2.

The weight reduction (TG) is discussed. In any of samples of FIG. 13 to FIG. 15, when the temperature was raised to about 350° C., gentle weight reductions were observed in the same manner. In the TG-DTA profile of the quantum dot in the Example shown in FIG. 13, when the temperature was raised from 50° C. to about 350° C., the weight reduction of 3% was observed. In the TG-DTA profile of the quantum dot in Comparative Example 1 shown in FIG. 14, when the temperature was raised from 50° C. to about 350° C., the weight reduction of 2% was observed. In the TG-DTA profile of the quantum dot in Comparative Example 2 shown in FIG. 15, when the temperature was raised from 50° C. to about 350° C., the weight reduction of 4% was observed.

On the other hand, when the temperature exceeded around 350° C., abrupt weight reductions were observed in any of the samples, and were almost constant at around 490° C.

However, in the Example and Comparative Examples, the following difference was observed. In the Example, as shown in FIG. 13, in the TG-DTA profile, the weight reduction (TG) from 50° C. to 490° C. was within 75%, and specifically, was 72%. In other words, in the Example, the weight reduction in raising the temperature from 350° C. to 490° C. was within 70%, and specifically, was 69%. In contrast thereto, it was found that in Comparative Example 1 shown in FIG. 14, the weight reduction (TG) from 50° C. to 490° C. was about 93%, and that in Comparative Example 2 shown in FIG. 15, the weight reduction (TG) from 50° C. to 490° C. was about 90%. In other words, in Comparative Example 1, the weight reduction in raising the temperature from 350° C. to 490° C. was about 91%. In Comparative Example 2, the weight reduction in raising the temperature from 350° C. to 490° C. was about 86%. In other words, in the Comparative Examples, it was understood that organic residues with a weight about nine times the quantum dot itself existed on the surface of the quantum dot. In contrast thereto, in the Example, it is possible to suppress organic residues adhering to the surface of the quantum dot within a weight about seven times the quantum dot or less.

Thus, in the quantum dot of the Example, it was understood that organic residues adhering to the surface are a few as compared with the quantum dots of the Comparative Examples.

Next, with respect to quantum dots respectively obtained via the cleaning steps of the above-mentioned Example and Comparative Example 1, qualitative analysis was performed at 350° C. at which the abrupt weight reduction started in TG-DTA measurement.

(GC-MS)
Apparatus name: GC-2010 (GC part), GCMS-QP 2010 (MS part) made by Shimadzu Corporation
Column: Ultra Alloy 5 made by Frontier Lab., Length 30 m, Film thickness 0.25 μm, Inner diameter 0.25 mm ID
Electron ionization energy: 70 eV
Rate of temperature rise: 50° C./min from 35° C. to 320° C., subsequently 320° C. was kept for 12 minutes and 30 seconds.
Carrier gas: Helium As a procedure of qualitative analysis, a GC spectrum at 350° C. is measured, and each peak of the spectrum is selected to analyze an MS spectrum. Then, candidate substances with high matching degrees (SI) are automatically extracted from the database (DB), and identification is performed by comparing the MS spectrum, the MS spectrum of the candidate substance of the DB and the matching degree. At this point, when SI is 90% or more, it is possible to obtain high reliability. The above-mentioned procedure is performed on each GC spectrum.

Figure 16:
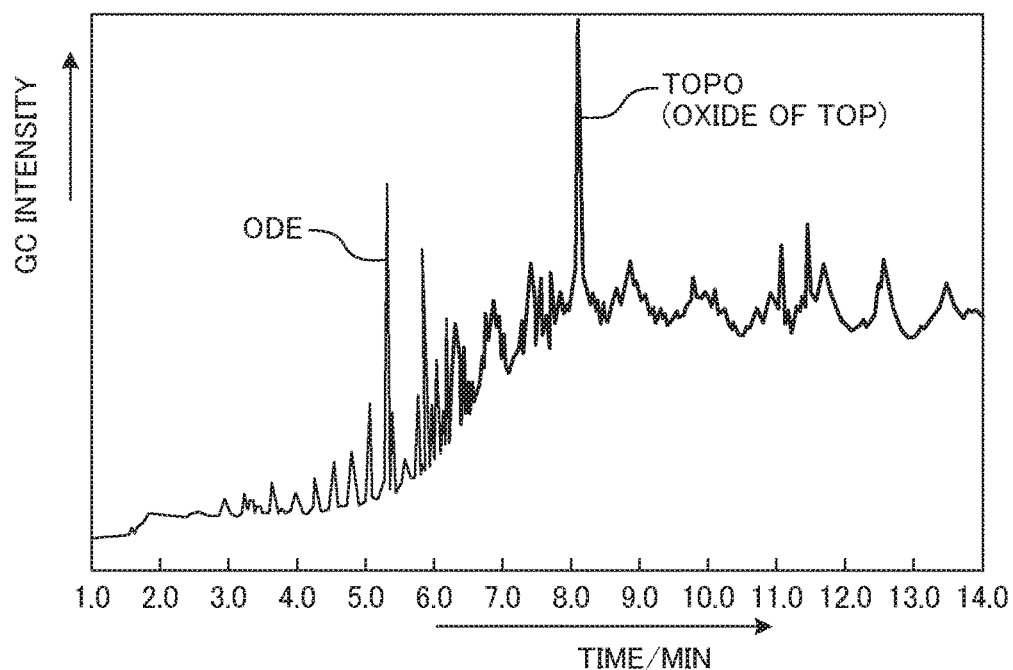
FIG. 16 is a GC-MS spectrum (350° C.) of the quantum dot in the Example.
Figure 17:
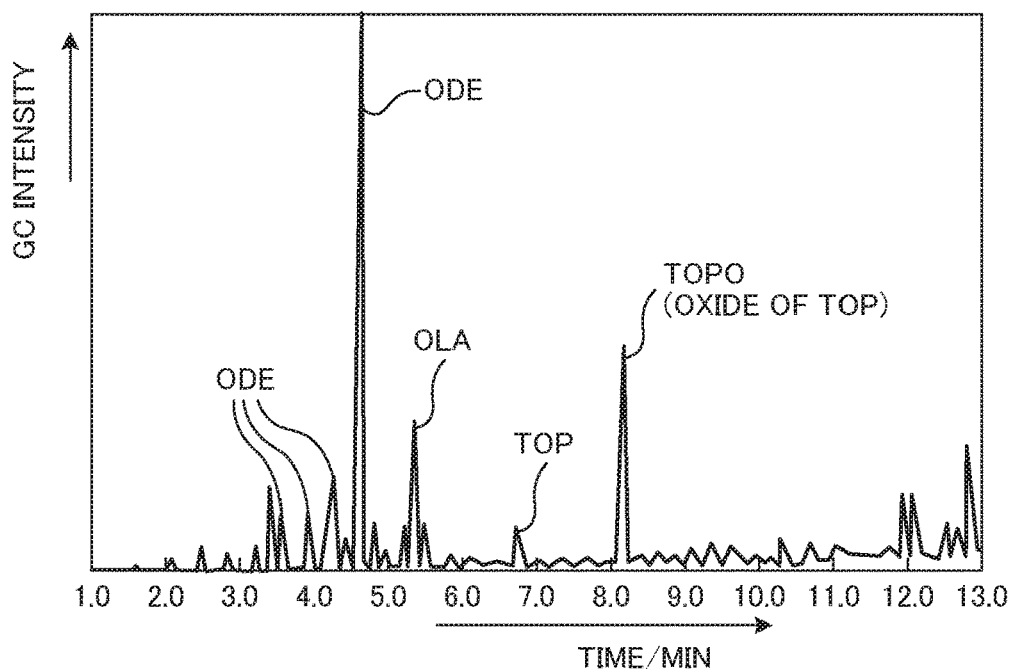
FIG. 17 is a GC-MS spectrum (350° C.) of the quantum dot in comparative Example 1.

FIG. 16 is a GC-MS spectrum (350° C.) of the quantum dot in the Example, and FIG. 17 is a GC-MS spectrum (350° C.) of the quantum dot in comparative Example 1.

Based on the above-mentioned qualitative analysis, as shown in FIG. 16, in the Example, octadecene (ODE) and trioctylphosphine oxide (TOPO) were observed. On the other hand, in Comparative Example 1 shown in FIG. 17, as well as ODE and TOPO, oleylamine (OLA) and trioctylphosphine (TOP) were observed. In addition, TOPO is an oxide of TOP.

In the Example with excellent dispersion characteristics, as shown in FIG. 16, the intensity of the GC spectrum is weak, and it is possible to presume that organic residues adhering to the quantum dot surface are a few. Actually, observed spectra were only the ODE spectrum and TOPO spectrum.

On the other hand, in the Comparative Example with poor dispersion characteristics, as shown in FIG. 17, ODE, OLA, TOP and TOPO were observed which were organic residues having sharp peaks. As the reason why OLA and TOP that were not observed in the Example were observed in the Comparative Example, it is considered that organic substances derived from raw materials used in the generation process of the quantum dot were suitably not removed in the cleaning step.

(Black Discoloration Examination of the LED Apparatus)

When the LED apparatus shown in FIG. 1A was prepared using the quantum dot of the Comparative Example in the fluorescent layer, black discoloration was observed inside the fluorescent layer 4 positioned immediately above the LED chip 3. In FIG. 1A, black discoloration was observed inside the fluorescent layer 4 in a portion in contact with the upper surface of the LED chip 3. In the configuration shown in FIG. 1B, black discoloration was observed inside the fluorescent layer 4 in the vicinity of the boundary between the fluorescent layer 4 and the resin layer 12 above the LED chip 3.

On the other hand, when the LED apparatuses shown in FIGS. 1A and 1B were prepared using the quantum dot of the Example in the fluorescent layer, as distinct from the Comparative Example, black discoloration was not seen in the fluorescent layer 4 positioned immediately above the LED chip 3. In other words, when the LED apparatus is prepared using the quantum dot of the Example in the fluorescent layer and the light emission test is performed at 85° C. for 1000 hours, deterioration of light emission intensity at a peak wavelength of each of RGB after the test is all suppressed within 30% as compared with the light emission intensity at each of the peak wavelengths of RGB before the test. By this means, it is possible to obtain the LED apparatus without black discoloration occurring.

As described above, the conditions of the cleaning step were different between the quantum dot of the Example and the quantum dot of the Comparative Example, and in the Example, from the results of the TG-DTA profile and GM-MS analysis, it was understood that it is possible to reduce organic residues adhering to the quantum dot surface, as compared with the Comparative Example. By this means, in the Example, it is considered that a large amount of organic residues were not taken in the fluorescent layer of the LED apparatus as compared with the Comparative example, thereby resulting in reduction in black discoloration. In addition, the experiments were performed in the LED apparatuses of FIG. 1A or 1B, and in each of configurations as shown in FIGS. 4 to 9, it is possible to similarly suppress the black discoloration occurrence.

(In Regard to Cleaning with the Centrifuge)

For example, the condition of the centrifuge in the Example was set at 8,875×g, and the centrifugation time was set at 5 minutes (first time), and at 2 minutes (second time). Further, with respect to 50 mL of the QD undiluted solution, the solvent used in the first time was made of 43.4 g (50 mL) of toluene, and 63.2 g (80 mL) of ethanol. Further, the solvent used in the second-time cleaning was made of 2.3 g (2.7 mL) of toluene, and 6.3 g (8 mL) of ethanol. Then, the recovered QD was dispersed in 2 mL of toluene to obtain a QD concentrated solution. As compared with the conditions of the Example as shown in FIG. 11, it was controlled that the rotation of the centrifuge was fast, and that the centrifugation time was short. Further, it was possible to also decrease the amount of the solvent. When the TG-DTA profile of the quantum dot was measured on the same conditions as in the Example, the weight reduction (TG) from 50° C. to 490° C. was within 75%. Furthermore, the weight reduction in raising the temperature from 350° C. to 490° C. was within 70%. Still furthermore, when the GC-MS spectrum of the quantum dot at 350° C. was measured on the same condition as in the Example, octadecene (ODE) and trioctylphosphine oxide (TOPO) were observed, and oleylamine (OLA) and trioctylphosphine (TOP) were not observed. When the LED apparatuses shown in FIGS. 1A and 1B were prepared using the quantum dot in the fluorescent layer, black discoloration was not seen in the fluorescent layer 4 positioned immediately above the LED chip 3. In other words, when the LED apparatus is prepared using the quantum dot of the Example in the fluorescent layer and the light emission test is performed at 85° C. for 1000 hours, deterioration of light emission intensity at a peak wavelength of each of RGB after the test is all suppressed within 30% as compared with the light emission intensity at each of the peak wavelengths of RGB before the test. By this means, it is possible to obtain the LED apparatus without black discoloration occurring.

(In Regard to Cleaning with the Ultracentrifuge)

A concentration test of the quantum dot was performed using the following ultracentrifuge.

Apparatus name: BecKman Optima MAX-XP
Condition: 435,000×g (100,000 rpm)
Time: 15 minutes Using quantum dots of two kinds of core/multi-shell structures of ZnCdSeS (Green)/ZnCdS (Shell I)/ZnS (Shell II) and CdSe (Red)/ZnCdS (Shell I)/ZnS (Shell II), QD concentrated solutions were obtained based on the steps shown in FIG. 12. In any of the solutions, concentration precipitation of quantum dots was seen.

According to the cleaning step using the ultracentrifuge, as compared with the cleaning step using the centrifuge, it is possible to effectively promote concentration precipitation, and it is expected to enhance the cleaning effect by the concentration precipitation. Further, it is possible to decrease the solvent amount and cleaning time, and it is possible to reduce the manufacturing cost. When the TG-DTA profile of the quantum dot was measured on the same condition as in the Example, the weight reduction (TG) from 50° C. to 490° C. was within 75%. Furthermore, the weight reduction in raising the temperature from 350° C. to 490° C. was within 70%. Still furthermore, when the GC-MS spectrum of the quantum dot at 350° C. was measured on the same condition as in the Example, octadecene (ODE) and trioctylphosphine oxide (TOPO) were observed, and oleylamine (OLA) and trioctylphosphine (TOP) were not observed. When the LED apparatuses shown in FIGS. 1A and 1B were prepared using the quantum dot in the fluorescent layer, black discoloration was not seen in the fluorescent layer 4 positioned immediately above the LED chip 3. In other words, when the LED apparatus is prepared using the quantum dot of the Example in the fluorescent layer and the light emission test is performed at 85° C. for 1000 hours, deterioration of light emission intensity at a peak wavelength of each of RGB after the test is all suppressed within 30% as compared with the light emission intensity at each of the peak wavelengths of RGB before the test. By this means, it is possible to obtain the LED apparatus without black discoloration occurring.

INDUSTRIAL APPLICABILITY

By dispersing the quantum dot of the present invention in the fluorescent layer of the LED apparatus, it is possible to manufacture the LED apparatus without black discoloration occurring in the fluorescent layer positioned immediately above the LED chip. As the light emitting device, as well as an LED, it is possible to adopt organic EL and the like. By varying materials of the quantum dot used in the fluorescent layer, it is possible to convert a wavelength of color in the florescent layer into various wavelengths, and it is possible to manufacture the light emitting apparatus which has a wide variety of fluorescent colors without black discoloration occurring and has long apparatus life.

The present application is based on Japanese Patent Application No. 2014-079562 filed on Apr. 8, 2014, entire content of which is expressly incorporated by reference herein.

The invention claimed is:

1. A method of manufacturing a quantum dot having a core/shell structure provided with a semiconductor-particle core portion and at least two of Cd, Se, S, and Zn, the method comprising:
    preparing a quantum dot solution by coating a surface of the core portion with a shell portion using a continuous injection method, the preparing comprises a generation process using raw materials which derive from oleylamine (OLA) and trioctylphosphine (TOP); and
    cleaning the quantum dot solution using an ultracentrifuge by centrifuging the quantum dot solution to generate a supernatant and precipitated coated core, and removing the supernatant solution from the precipitated coated core,
    wherein the ultracentrifuge operates at 100,000 rpm or more for a duration of at least 15 minutes, whereupon the precipitated coated core comprises a property such that OLA and TOP are not observed in a GC-MS qualitative analysis at 350° C.

2. The method of manufacturing a quantum dot according to claim 1, wherein the shell portion is formed of a first shell portion coating the core portion, and a second shell portion coating the surface of the first shell portion.

* * * * *